(12) United States Patent
Hahn (10) Patent No.: US 7,952,684 B2
(45) Date of Patent: *May 31, 2011

(54) LIGHT-MODULATING NANO/MICRO SCALE APERTURE ARRAY DEVICE HAVING IMMERSION LAYER AND HIGH SPEED NANO SCALE PATTERN RECORDING SYSTEM USING THE SAME

(75) Inventor: Jae Won Hahn, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 316 days.

This patent is subject to a terminal disclaimer.

(21) Appl. No.: 11/662,934

(22) PCT Filed: Jul. 22, 2005

(86) PCT No.: PCT/KR2005/002379
§ 371 (c)(1),
(2), (4) Date: Mar. 16, 2007

(87) PCT Pub. No.: WO2006/132453
PCT Pub. Date: Dec. 14, 2006

(65) Prior Publication Data
US 2008/0297757 A1 Dec. 4, 2008

(30) Foreign Application Priority Data
Jun. 9, 2005 (KR) .................. 10-2005-0049084

(51) Int. Cl.
*G03B 27/42* (2006.01)
*G03B 27/52* (2006.01)
*G03B 27/54* (2006.01)
*G03B 27/72* (2006.01)

(52) U.S. Cl. ............... 355/53; 355/30; 355/55; 355/67; 355/71

(58) Field of Classification Search ............ 355/18, 355/53, 30, 52, 55, 67–71, 77, 80, 84, 95; 359/290, 618, 619, 642, 663, 676, 295, 310, 359/316, 322; 250/492.1, 492.2, 492.22, 250/548

See application file for complete search history.

(56) References Cited

U.S. PATENT DOCUMENTS
4,509,824 A * 4/1985 Yamasaki et al. ............ 359/619
(Continued)

FOREIGN PATENT DOCUMENTS
JP 2000251340 A * 9/2000
(Continued)

OTHER PUBLICATIONS
International Search Report, Korean Intellectual Property Office, Mar. 8, 2006 (PCT/KR2004/002379).

*Primary Examiner* — Peter B Kim
*Assistant Examiner* — Christina Riddle
(74) *Attorney, Agent, or Firm* — Venable LLP; Jeffri A. Kaminski (57) ABSTRACT

An optical modulating fine aperture array device is provided. The device includes a spatial light modulation unit provided with at least one light capacity cell arranged in a shape of a matrix, wherein each of the light capacity control cells is capable of individually controlling a degree of an inputted light which passing therethrough. A micro-lens array is provided with at least one micro-lens arranged in a shape of a matrix, wherein each of the micro-lenses condenses the light passing through each of the light capacity control cells. A substrate is made of an optical transparent material. The micro-lens array is attached to one side of the substrate. An aperture array is arranged on other side surface of the substrate and provided with at least one fine aperture. An immersion thin film layer is made of an optically transparent dielectric, including and formed to have a predetermined thickness from the aperture array.

11 Claims, 4 Drawing Sheets

U.S. PATENT DOCUMENTS

| | | | |
|---|---|---|---|
| 5,121,256 A * | 6/1992 | Corle et al. | 359/664 |
| 5,130,852 A * | 7/1992 | Hamanaka | 359/741 |
| 5,610,683 A * | 3/1997 | Takahashi | 355/53 |
| 5,631,731 A * | 5/1997 | Sogard | 356/121 |
| 5,715,039 A * | 2/1998 | Fukuda et al. | 355/53 |
| 6,091,694 A * | 7/2000 | Spath | 369/112.25 |
| 6,171,730 B1 * | 1/2001 | Kuroda et al. | 430/5 |
| 6,191,429 B1 * | 2/2001 | Suwa | 250/548 |
| 6,195,196 B1 * | 2/2001 | Kimura et al. | 359/295 |
| 6,312,134 B1 * | 11/2001 | Jain et al. | 359/855 |
| 6,324,149 B1 | 11/2001 | Mifune et al. | |
| 2003/0123040 A1 * | 7/2003 | Almogy | 355/69 |
| 2004/0125351 A1 * | 7/2004 | Krautschik | 355/53 |
| 2004/0246457 A1 * | 12/2004 | Okazaki | 355/67 |
| 2005/0094119 A1 * | 5/2005 | Loopstra et al. | 355/67 |
| 2005/0168823 A1 * | 8/2005 | Ishii et al. | 359/626 |
| 2005/0200821 A1 * | 9/2005 | Gui | 355/67 |
| 2005/0245005 A1 * | 11/2005 | Benson | 438/127 |
| 2006/0001855 A1 * | 1/2006 | Lof et al. | 355/69 |
| 2006/0078637 A1 * | 4/2006 | Goruganthu et al. | 425/174.4 |
| 2006/0132731 A1 * | 6/2006 | Jansen et al. | 355/30 |

FOREIGN PATENT DOCUMENTS

| | | |
|---|---|---|
| KR | 1020010103476 | 11/2001 |
| KR | 1020050001086 | 1/2005 |
| KR | 1020050063857 | 6/2005 |

* cited by examiner

LIGHT-MODULATING NANO/MICRO SCALE APERTURE ARRAY DEVICE HAVING IMMERSION LAYER AND HIGH SPEED NANO SCALE PATTERN RECORDING SYSTEM USING THE SAME

TECHNICAL FIELD

The present invention relates to an optical modulation fine aperture array device capable of recording a fine pattern by modulating a light inputted thereto; and, more particularly, to an optical modulation fine aperture array device capable of reducing a size of a light beam that is approaching the fine aperture and maintaining a uniform interval between the fine aperture and the recording medium uniform by applying liquid or solid dielectric materials having refractive index higher than that of air to an aperture array in which a plurality of fine apertures arranged in a matrix shape, wherein each of fine apertures has a high transmissions rate and a size of several nm to several tens nm. And also, the present invention relates to a high speed fine pattern recording system to record the fine pattern on the recording medium at a high rate by using such an optical modulation fine aperture array device.

BACKGROUND ART

Generally, a lithography technology used for manufacturing a semiconductor device is composed of a masking process for manufacturing a photo mask where a fine pattern is recorded and an exposing process for exposing the manufactured photo mask on the photo mask coated on a substrate. Recently, as the semiconductor device has been highly integrated, a line width of a pattern in the photo mask tends to be narrow. The line width of the pattern to be implemented with an optical system of the lithography is limited by a resolution, and the pattern becomes fine, as the resolution is small.

On the other hand, in order to reduce the resolution, a numerical aperture becomes large or a light source with a short wavelength is used. Currently, a resolution having a degree of 70~100 nm is realized by using an argon fluoride (ArF) Excimer laser with an ultraviolet wavelength of 193 nm. In order to realize the resolution having higher than this, a further shorter wavelength, for example a laser having a wavelength of 157 nm is used as a light source. However, in order to increase the resolution by using the ultraviolet having such short wavelength, a high quality fused silica must be replace with a calcium fluoride (CaF) as a material of an optical system component of the lithography device, and the used photo resist must be replaced with a new material sensitive to the ultraviolet ray.

A method for using an aperture below 100 nm is used as another method for increasing the resolution, in this method a near field formed near the aperture by transmitting the aperture is used. At this time, if the size of the aperture is reduced to increase the resolution, since an intensity of the light passing through the aperture unit becomes small in proportion to 4 square of the size of the aperture, there is a problem that an exposure time becomes long.

In order to solve these problems, the applicant proposes "TWO DIMENSIONAL OPTICAL MODULATION FINE APERTURE ARRAY DEVICE AND HIGH SPEED FINE PATTERN RECORDING SYSTEM USING THE SAME" in Korean Patent Application No. 10-2003-42649. In this device, the fine pattern is directly recorded on a recording medium without using a photo mask by using a metal optical waveguide type aperture drastically improving a light transmission rate. In using this device, a light beam having a wavelength of 70 nm can be theoretically generated by using an argon ion laser (blue laser) having a wavelength of 488 nm as a light source.

However, a size of the light beam formed as described above is reduced in proportion to a wavelength of the used light source. Therefore, although the technology described in the application is used, a wavelength of the used light source must be reduced in order to reduce a size of the condensed light beam; and, accordingly a technical limitation described above occurs by a type of the light source to be used.

And also, in order to record information with high reliability by using a device employing a near field formed by an aperture array provided with a single or a plurality of fine apertures, a distance between the aperture array device and the recording medium should be uniform. In case when the distances between each of the fine apertures and the recording medium are not uniform, even though the intensity of the inputted light is uniform over a whole region of the aperture region, a size of the light beam or an intensity of the light beam formed on a surface of the recording medium can be varied by each of the apertures.

DISCLOSURE OF INVENTION

Technical Problem

The present invention has been proposed in order to overcome the above-described problems in the background art. It is, therefore, an object of the present invention to provide a device capable of reducing a size of a light beam by reducing an effective wavelength of a light by arranging a dielectric layer having a refractive index higher than that of air between an aperture array and a recording medium.

And also, it is another object of the present invention to provide a device capable of maintaining an interval between an aperture and a recording medium during recording the fine pattern using a near field, particularly between an aperture array provided with a plurality of fine apertures and the recording medium, uniform.

Technical Solution

In accordance with one aspect of the present invention, there is provided an optical modulating fine aperture array device, including: a spatial light modulation unit provided with at least one light capacity cell arranged in a shape of a matrix, wherein each of the light capacity control cells is capable of individually controlling a degree of an inputted light which passing therethrough; a micro-lens array provided with at least one micro-lens arranged in a shape of a matrix, wherein each of the micro-lenses condenses the light passing through each of the light capacity control cells; a substrate made of an optical transparent material and having a thickness substantially to a focal length of the micro-lens, wherein the micro-lens array is attached to one side of the substrate; an aperture array arranged on other side surface of the substrate and provided with at least one fine aperture, wherein each of the fine apertures discharges light passing through the substrate by condensing the light by each of the micro-lenses; and an immersion thin film layer made of an optically transparent dielectric, including and formed to have a predetermined thickness from the aperture array.

In accordance with one aspect of the present invention, the immersion thin film layer can be made of a solid. It is preferable that the optical modulating fine aperture array device further includes a protection layer arranged on a surface facing the aperture array of the immersion thin film layer. And also, it is preferable that the protection layer is made of a diamond like carbon.

In accordance with one aspect of the present invention, the immersion thin film layer can be made of a liquid. In this case, at least one portion of a region encompassing these with a predetermined distance from each fine aperture of the aperture array is made of a solid and a surface of a wall member coated with a protection layer with having a thickness equal to the immersion thin film layer.

In accordance with one aspect of the present invention, each of the fine apertures of the aperture array is filled with a material same as the immersion thin film layer.

In accordance with another aspect of the present invention, there is provided a high speed fine pattern recording system, including: a light source unit for emitting light having a predetermined wavelength; a light transmission unit for transmitting the light emitted from the light source unit; a parallel light generation unit for making the light transmitted from the light transmission unit a parallel light; an optical modulation fine aperture array device includes: a two dimensional spatial optical modulation unit provided with at least one light capacity cell arranged in a shape of a matrix, wherein each of the light capacity control cells is capable of individually controlling a degree of an inputted light which passing therethrough; a micro-lens array provided with at least one micro-lens arranged in a shape of a matrix, wherein each of the micro-lenses condenses the light passing through each of the light capacity control cells; a substrate made of an optical transparent material and having a thickness substantially to a focal length of the micro-lens, wherein the micro-lens array is attached to one side of the substrate; an aperture array arranged on other side surface of the substrate and provided with at least one fine aperture, wherein each of the fine apertures discharges light passing through the substrate by condensing the light by each of the micro-lenses; and an immersion thin film layer made of an optically transparent dielectric, including and formed to have a predetermined thickness from the aperture array; a recording medium supporting device for supporting a recording medium on which a predetermined pattern is recorded by the light emitted from the aperture array of the two dimensional optical modulation fine aperture array device; and a scan device generating a relative movement between the two dimensional optical modulation fine aperture array device and the recording medium supported by the recording medium supporting device by being connected to the two dimensional optical modulation fine aperture array device or the recording medium supporting device and moving the connected devices.

In accordance with one aspect of the present invention, a relative movement between the optical modulation fine aperture array device and the recording medium is performed at a state that the protection layer is in contact with the surface of the protection layer.

Preferably, the recording medium supporting device secures that a relative movement is capable of being performed by applying a pressure a surface of the recording medium which is not in contact with the protection layer in the recording medium with a state that a surface of the immersion thin film layer is well in contact with the surface of the recording medium.

Hereinafter, an optical modulation fine aperture array device and a high speed fine pattern recording system using the same will be described in detail in accordance with preferred embodiments of the present invention with reference to the accompanying drawings.

ADVANTAGEOUS EFFECTS

In accordance with one aspect of the present invention, there is provided a fine aperture array device capable of reducing an effective wavelength of light and reducing a size of a condensed light beam. Therefore, the present invention is capable of increasing a recording density or a resolution of a fine pattern with using a conventional light source and a photoresist.

In accordance with another aspect of the present invention, if an aperture array provided with a plurality of fine apertures is utilized, there is provided a fine pattern recording system to maintain an interval between an aperture and a recording medium uniform over a whole region of the aperture array. Accordingly, information can be recorded on a recording medium with a required reliability.

BRIEF DESCRIPTION OF THE DRAWINGS

These and other features, aspects, and advantages of preferred embodiments of the present invention will be more fully described in the following detailed description, taken accompanying drawings. In the drawings.

BEST MODE FOR CARRYING OUT THE INVENTION

In order to implement the above-described technical solutions, in accordance with one aspect of the present invention, there is provided an optical modulating fine aperture array device, including: a spatial light modulation unit provided with at least one light capacity cell arranged in a shape of a matrix, wherein each of the light capacity control cells is capable of individually controlling a degree of an inputted light which passing therethrough; a micro-lens array provided with at least one micro-lens arranged in a shape of a matrix, wherein each of the micro-lenses condenses the light passing through each of the light capacity control cells; a substrate made of an optical transparent material and having a thickness substantially to a focal length of the micro-lens, wherein the micro-lens array is attached to one side of the substrate; an aperture array arranged on other side surface of the substrate and provided with at least one fine aperture, wherein each of the fine apertures discharges light passing through the substrate by condensing the light by each of the micro-lenses; and an immersion thin film layer made of an optically transparent dielectric, including and formed to have a predetermined thickness from the aperture array.

In accordance with one aspect of the present invention, the immersion thin film layer can be made of solid. It is preferable that the optical modulating fine aperture array device further includes a protection layer arranged on a surface facing the aperture array of the immersion thin film layer. And also, it is preferable that the protection layer is made of a diamond like carbon.

In accordance with one aspect of the present invention, the immersion thin film layer can be made of a liquid. In this case, at least one portion of a region encompassing these with a predetermined distance from each fine aperture of the aperture array is made of a solid and a surface of a wall member coated with a protection layer with having a thickness equal to the immersion thin film layer.

In accordance with one aspect of the present invention, each of the fine apertures of the aperture array is filled with a material same as the immersion thin film layer.

In accordance with another aspect of the present invention, there is provided a high speed fine pattern recording system, including: a light source unit for emitting light having a predetermined wavelength; a light transmission unit for transmitting the light emitted from the light source unit; a parallel light generation unit for making the light transmitted from the light transmission unit a parallel light; an optical modulation fine aperture array device includes: a two dimensional spatial optical modulation unit provided with at least one light capacity cell arranged in a shape of a matrix, wherein each of the light capacity control cells is capable of individually controlling a degree of an inputted light which passing therethrough; a micro-lens array provided with at least one micro-lens arranged in a shape of a matrix, wherein each of the micro-lenses condenses the light passing through each of the light capacity control cells; a substrate made of an optical transparent material and having a thickness substantially to a focal length of the micro-lens, wherein the micro-lens array is attached to one side of the substrate; an aperture array arranged on other side surface of the substrate and provided with at least one fine aperture, wherein each of the fine apertures discharges light passing through the substrate by condensing the light by each of the micro-lenses; and an immersion thin film layer made of an optically transparent dielectric, including and formed to have a predetermined thickness from the aperture array; a recording medium supporting device for supporting a recording medium on which a predetermined pattern is recorded by the light emitted from the aperture array of the two dimensional optical modulation fine aperture array device; and a scan device generating a relative movement between the two dimensional optical modulation fine aperture array device and the recording medium supported by the recording medium supporting device by being connected to the two dimensional optical modulation fine aperture array device or the recording medium supporting device and moving the connected devices.

In accordance with one aspect of the present invention, a relative movement between the two dimensional optical modulation fine aperture array device and the recording medium is performed at a state that the protection layer is in contact with the surface of the protection layer.

Preferably, the recording medium supporting device secures that a relative movement is capable of being performed by applying a pressure a surface of the recording medium which is not in contact with the protection layer in the recording medium with a state that a surface of the immersion thin film layer is well in contact with the surface of the recording medium.

Hereinafter, an optical modulation fine aperture array device and a high speed fine pattern recording system using the same will be described in detail in accordance with preferred embodiment of the present invention with reference to the accompanying drawings.

Figure 1:
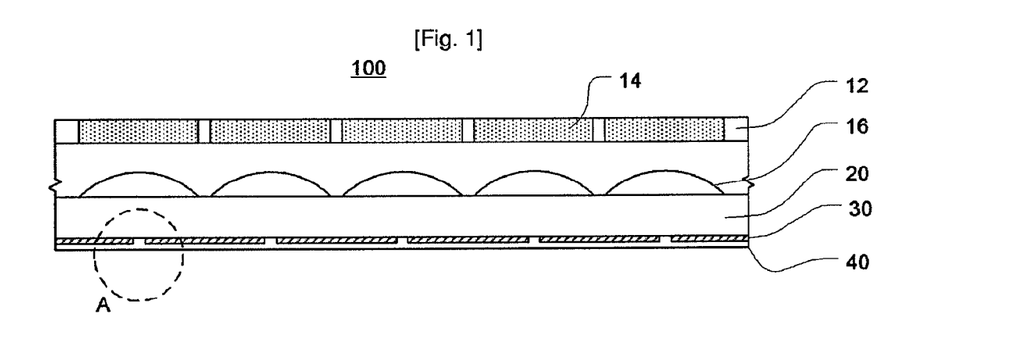
FIG. 1 shows a cross-sectional view schematically showing an optical modulation fine aperture array device in accordance with the present invention.

FIG. 1 shows a cross-sectional view schematically showing an optical modulation fine aperture array device in accordance with the present invention.

An optical modulation fine aperture array device 100 includes a liquid crystal light modulation unit 12, a micro-lens array 16, a substrate 20, an aperture array and an immersion thin film layer 40.

The liquid crystal light modulation unit 12 is provided with a plurality of light capacity control cells 14 arranged in a predetermined shape as one type of a spatial light modulator, wherein each of the light capacity control cells 14 controls a light capacity transmitted therethrough. For example, the light capacity control cell 14 can be made of a liquid crystal to change a light transmission rate according to a voltage applied thereto. In the embodiments of the present invention, there is described a case that a liquid cell is used as the light capacity control cells 14.

The liquid crystal cells 14 can be arranged in a shape of a matrix formed in a line or at least two columns. In case of at least two columns, a center of the liquid crystal cells 14 at each column is misaligned from each other. An arrangement and number of the liquid crystal cells 14 are changed according to a size of the liquid crystal cell, application fields or the like. Meanwhile, a light transmission rate of each liquid crystal cell 14, for example, is changed according to a voltage applied thereto. The light transmission rate of each liquid crystal 14 is changed between two set values of 0% and 100% or it can be set to change a plurality of steps. And also, it is preferable that the light transmission rate of each liquid crystal cell 14 is controlled individually. That is, the light transmission rate of each liquid cell 14 is controlled independent of the light transmission rate of adjacent liquid crystal cells 14.

The micro-lens array 16 is provided with a plurality of micro-lenses arranged in a predetermined shape, and each of the micro-lenses condenses the light passing through the liquid crystal cells 14. Therefore, it is preferable that each micro-lens of the micro-lens array 16 corresponds to each liquid cell 14 of the spatial light modulation unit 12. However, it is not required that one micro-lens corresponds to one liquid crystal cell 14, but a plurality of micro-lenses can correspond to one liquid crystal cell 14 under the necessity. At any case, an optical axis of each liquid crystal cell 14 is aligned with an optical axis of the corresponding liquid crystal cell 14.

The micro-lens array 16 is attached to one side surface of the substrate 20, and the substrate 20 is made of an optically transparent material. A thickness of the substrate 20 is substantially equal to a focal length of the micro-lens. Accordingly, the light condensed by the micro-lens is condensed on a different side surface of the substrate 20 facing a surface arranged thereon the micro-lens array 16 by passing an inside of the substrate 20.

The aperture array 30 is formed on the other side surface of the substrate 20, and is provided with a plurality of fine apertures arranged in a predetermined shape. Each fine aperture emits the light condensed by each of the micro-lenses. Therefore, the fine aperture is arranged in a method equal to the micro-lens. The aperture array 30 is obtained by forming a metal thin film on the other side surface of the substrate 20 by, for example a method such as a deposition, and by forming a plurality of fine apertures on the metal thin film by using a method such as an etching.

According to a recent study, there is disclosed a fact that a transmission rate is drastically increased by a plasmon effect and a waveguide effect of an aperture due to electrons in a metal thin film when the aperture having an appropriate shape is formed on a metal thin film. In this case, a size of the aperture has a size smaller than the wavelength of the light to be inputted thereto. For example, in a paper entitled as "A nano-aperture with 1000× power throughput enhancement for VSAL system" disclosed at SPIE Vol. 4342 in 2002, when a light having a wavelength of 1☐ is impinged on a C-shape fine aperture having a size of 220 nm in width and 300 nm in length, a transmission rate of approximately 1000 times in comparison with a case when the same light is impinged on an aperture having a right rectangle with a size of 100 nm in width and in length is reported. At this time, a light beam having an elliptic shape with a long axis of 136 nm and a short axis of 128 nm is represented for the C-shape fine aperture and a light beam having an elliptic shape with a long axis of 140 nm and a short axis of 80 nm is formed for the aperture having the right rectangle. The wavelength of the light is reduced or a size of the aperture is reduced in order to reduce the size of the light beam formed by the fine aperture.

On the other hand, if the light is inputted to the aperture of a generally nano size, an evanescent field which does not travel around the aperture is formed and the light passing through the aperture emits with a large angle by a diffraction effect. Therefore, in order to utilize the evanescent field formed around the aperture with a nano size, a distance between the fine aperture and the recording medium maintains below, for example 100 nm.

The fine aperture 32 of the aperture array 30 in accordance with the embodiment of the present invention uses these principles and a size and a shape of the fine aperture 340 can be determined according to a resolution required for an applied application field and a wavelength of a light used as an input light.

The fine aperture 32 of the aperture array 30 according to the embodiment of the present invention includes an immersion thin film layer 40 in order to further reduce the size of the light beam formed by the fine aperture 32.

Figure 2:
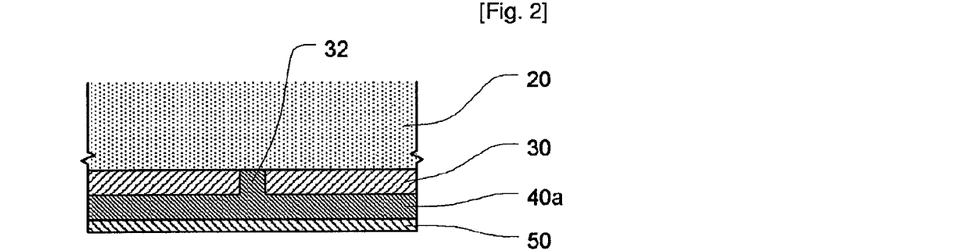
FIG. 2 is a partial enlargement cross-sectional view showing a structure around an aperture unit in the optical modulation fine aperture array device in accordance with a first embodiment of the present invention.
Figure 3:
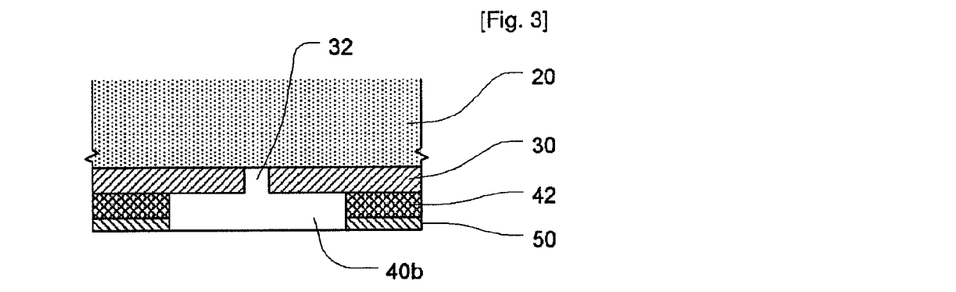
FIG. 3 represents a partial enlargement cross-sectional view showing a structure around an aperture unit in the optical modulation fine aperture array device in accordance with a second embodiment of the present invention.

FIG. 2 and FIG. 3 are diagrams enlarging portions represented by a circle A in FIG. 1. FIG. 2 is a partial enlargement cross-sectional view showing a structure around an aperture unit in the optical modulation fine aperture array device in accordance with a first embodiment of the present invention and FIG. 3 represents a partial enlargement cross-sectional view showing a structure around an aperture unit in the optical modulation fine aperture array device in accordance with a second embodiment of the present invention.

In the first embodiment shown in FIG. 2, a solid material being optically transparent and having a refractive index higher than that of air is utilized as the immersion thin film layer 40. The solid immersion thin film layer 40a is arranged inside of the fine aperture 32 and around the fine aperture 32. Since the refractive index of the solid immersion thin film layer 40a is higher than that of the air, the wavelength of the light emitted through the fine aperture 32 in the immersion thin film layer has a wavelength shorter than that of the light emitted through the aperture 32 in the air. Therefore, the size of the light beam formed by the fine aperture 32 becomes smaller than that of a case that it does not pass through the immersion thin film layer 40. If the size of the light beam becomes small, information can be recorded on the recording medium with a further smaller size. The material of the solid immersion thin film layer 40a can be a material such as an optically transparent photoresist, an ultraviolet ray coagulation resin or a copolymer. As described above, since the distance between the aperture 32 and the recording medium maintains below, for example 100 nm, in order to utilize the evanescent field formed around the fine aperture, the thickness of the solid immersion thin film layer 40a becomes smaller than this. Generally, it is preferable that the thickness becomes several nm degrees.

Preferably, a surface of the solid immersion thin film layer 40a is coated with a protection layer 50. The protection layer 50 is made of a material, which is optically transparent and has a high hardness. For example, a diamond like carbon (DLC) can be used as a material of the protection layer. The protection layer 50 prevents the immersion thin film layer 40a from damaging when the light modulation fine aperture array device moves with contacting to the recording medium.

The liquid can be used as a material consisting of the immersion thin film layer 40 in place of the solid. In FIG. 3, there is shown a structure around an aperture unit in the optical modulation fine aperture 32 when the present invention has a liquid immersion thin film layer 40b. The liquid consisting of the immersion thin film layer 40b fills the inside of the fine aperture 32 and a region around the fine aperture 32. A material, which is optically transparent and has a refractive index higher than that of air can be used as the liquid consisting of the liquid immersion thin film layer 40b. On the other hand, it is preferable that an interval maintenance member 42 is provided as a means to maintain the interval between the aperture array 30 and the recording medium 200 uniform. The interval maintenance member 42 is formed in a shape that encompasses the fine aperture 32 with at least a part of adjacent region of the fine aperture 32 with a predetermined interval from the fine aperture 32. Since the interval maintenance member 42 is relatively moved with contacting to the recording medium 200, it is preferable that a surface is coated with the protection layer 50 as like the solid immersion thin film layer 40a.

Figure 4:
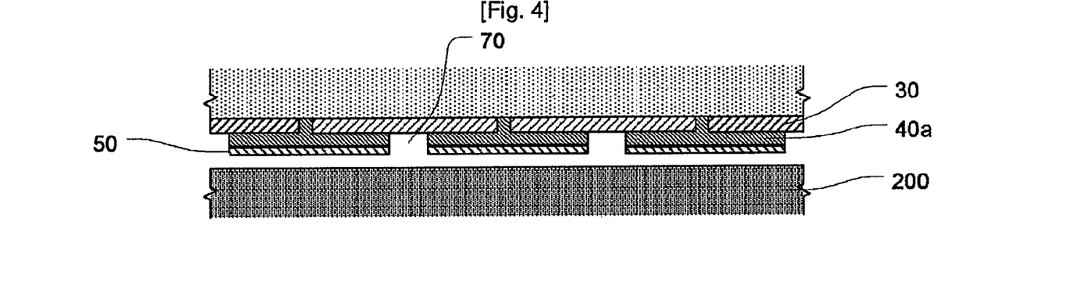
FIG. 4 depicts a diagram showing a state to record information on a recording medium by using the optical modulation fine aperture array device shown in FIG. 2.
Figure 5:
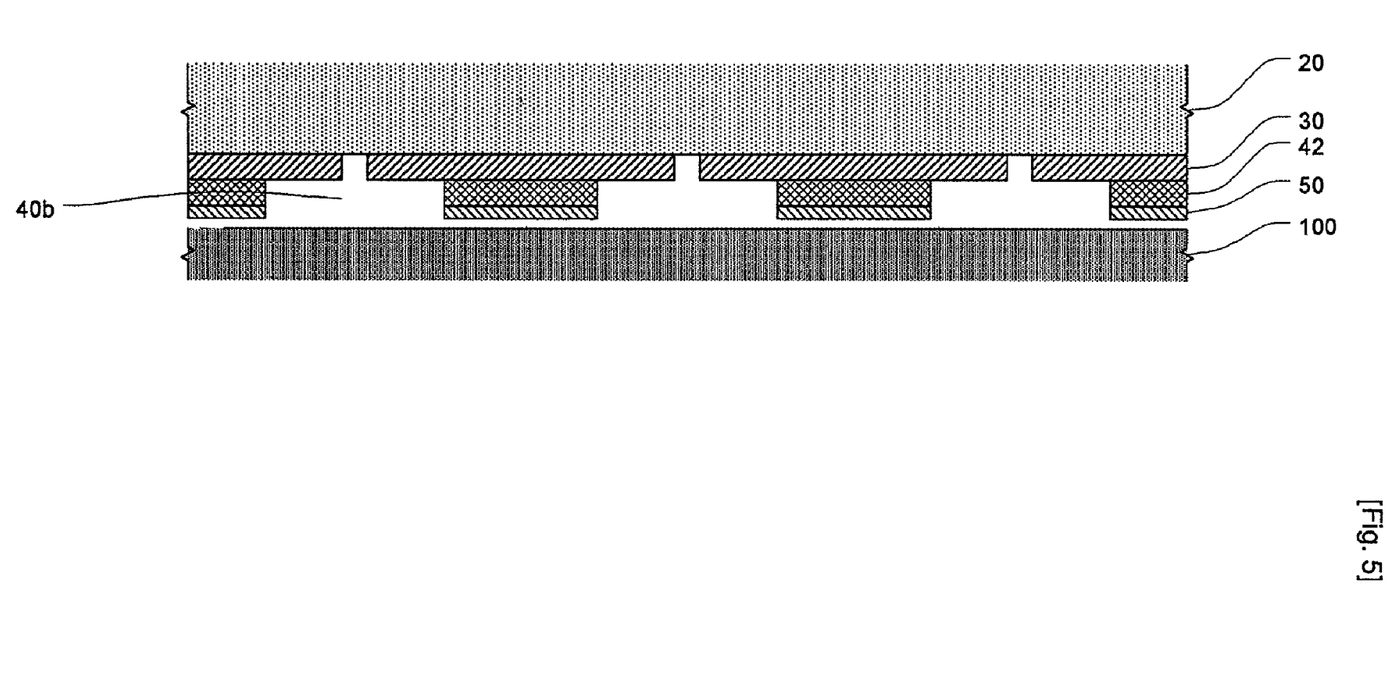
FIG. 5 illustrates a diagram showing a state to record information on a recording medium by using the optical modulation fine aperture array device shown in FIG. 3.

On the other hand, in FIG. 4, there is shown a modification embodiment of the optical modulation fine aperture array device shown in FIG. 2; and, in FIG. 5, there is shown a modification embodiment of the optical modulation fine aperture array device shown in FIG. 3.

The embodiment shown in FIG. 4 is related to an aperture array device 100 provided with a solid immersion thin film layer 40a. In this modification embodiment, a lubricant to aid a lubrication operation is provided so as to further smoothly perform a relative movement between the immersion thin film layer 40a and the recording medium 200. Therefore, a lubricant path 70 is prepared between the solid immersion thin film layers 40a so as to allow the lubricant to pass therethrough. A material, which does not absorb the evanescent field and is optically transparent, is used as the lubricant and it is preferable that the lubricant is a liquid.

The embodiment shown in FIG. 5 is related to an aperture array device 100 provided with a liquid immersion thin film layer 40b. As like the above embodiment, there is provided a lubricant to further smoothly to perform a relative movement between the immersion thin film layer 40b and the recording medium 200. Merely, since the immersion thin film layer 40b is a liquid, it is preferable that the lubricant is made of a material equal to the immersion thin film layer 40b.

The liquid used as the lubricant should be a material, which a dielectric constant is not greatly changed by a temperature change or pollution among the process and has a lubrication function.

Figure 6:
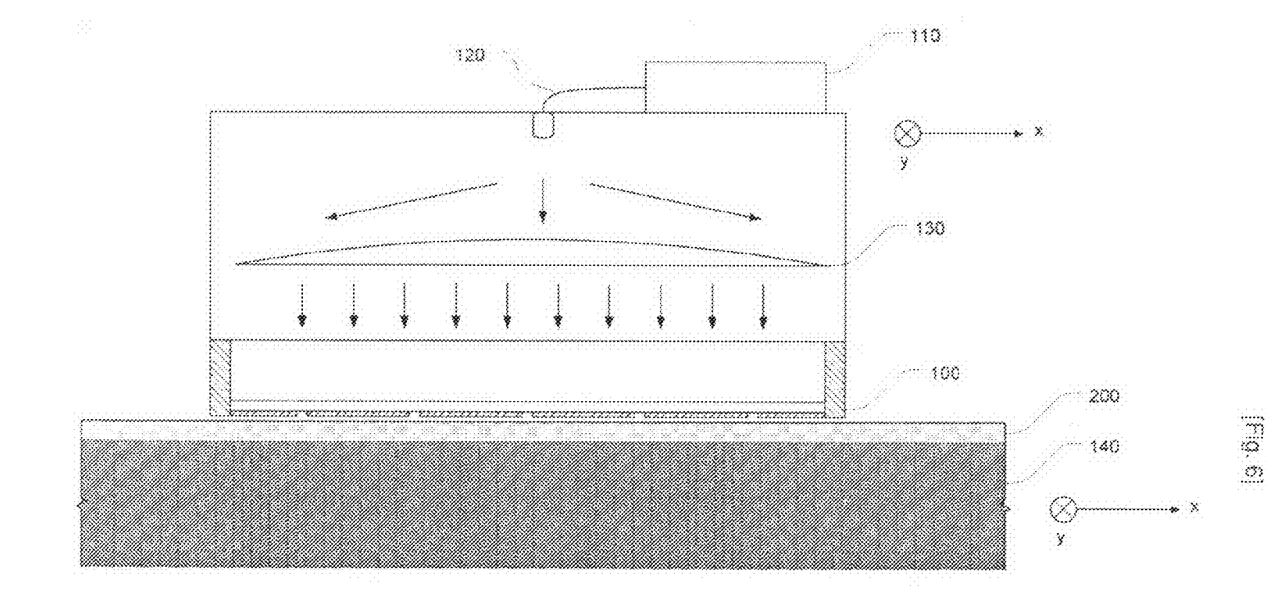
FIG. 6 is a diagram schematically showing a high speed fine pattern recording system provided with the optical modulation fine aperture array device.

FIG. 6 is a diagram schematically showing a high speed fine pattern recording system provided with the optical modulation fine aperture array device.

The high-speed fine pattern recording system includes a light source unit 110, a parallel light generation unit 130, a light modulation fine aperture array device 100 and a recording medium supporting unit 140.

The light source unit 110 generates a light, for example a laser light beam, to be supplied to the optical modulation fine aperture array device 100. When a pattern of the nano size is recorded, a continuous oscillation layer light source such as an Argon ion layer having a wavelength of 488 nm, a Helium cadmium laser having a wavelength of 442 nm, a diode laser having a wavelength of 405 nm, a third order harmonic wave of a Yag laser having a wavelength of 355 nm and a fourth order harmonic wave of a Yag laser having a wavelength of 266 nm can be used as a light to be generated at the light source unit 110.

The light generated at the light source unit 110 can be transmitted to a point needed by the light transmission unit 120. An optical fiber can be used as the light transmission unit 120. And also, an output stabilization unit (not shown) can be used to maintain the intensity of the light to be emitted from the light source unit 110 uniform. It is preferable that the light transmitted through the light transmission unit 120 is emitted by being spatially filtered.

The parallel light generation unit 130 makes the light transmitted from the light source unit 110 a parallel light in order to distribute the parallel light on wider region. For example, the parallel light generation lens can be used. The region, which is emitted by the parallel light, includes an overall area of at least optical modulation fine aperture array device 100. A beam homogenizer can be used so as to make the intensity distribution of the light uniform.

The optical modulation fine aperture array device 100 has a structure as shown in FIG. 1. A control device (not shown) individually controls a degree that the light inputted from the parallel light generation unit 130 is transmitted to each of the liquid crystal cells by controlling operations of each of the liquid crystal cells of the fine aperture array device 100.

The recording medium supporting device 140 supports the recording medium 200. The recording medium can be, for example, a wafer to manufacture a semiconductor device.

Although it does not shown, a scan device capable of relatively moving the fine aperture array device 100 and the recording medium supporting device 140 from each other is further included. The scan device is connected to the fine aperture array device 100 or the recording medium supporting device 140, and generated the above-described relative movement by horizontally moving the connected device. The relative movement, for example, after the fine aperture array device 100 is moved by a predetermined distance in an x-direction at a start point, it returns to a point moved by a predetermined interval in a y-direction from the start point, and is performed in a manner that it moved by the previous same distance in the x-direction from the start point again. The operation of the scan device is controlled by the above described control device.

If the aperture array 30 is provided with a plurality of fine apertures 32, an interval between the light beams generated by each fine aperture is determined by the interval arranged by the fine apertures. The distance moved by the scan device is determined by an interval between light beams, that is an interval between the fine apertures.

Figure 7:
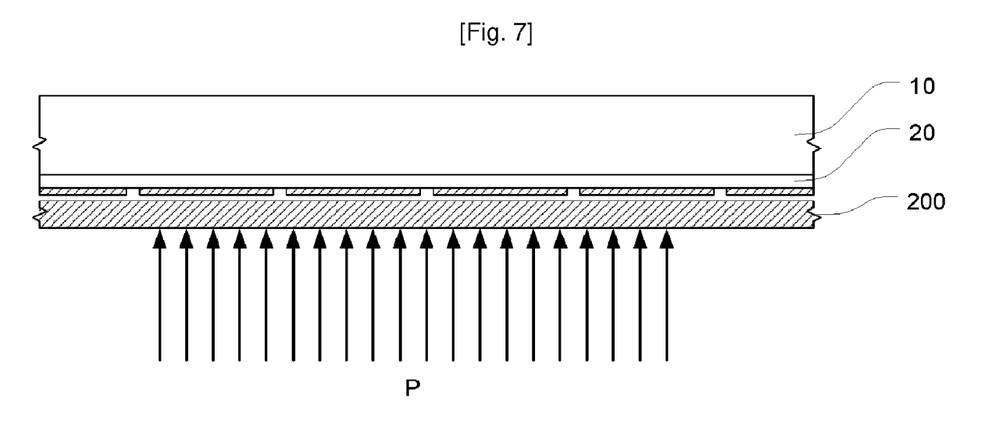
FIG. 7 is a diagram showing a device for applying pressure to a recording medium to control an interval between an optical modulation fine aperture array device and a recording medium in accordance with another embodiment of the present invention.

In FIG. 7, there is shown a unit to maintain an interval between an optical modulation fine aperture array device and a recording medium uniform in accordance with the present invention.

As described above, distances between all fine apertures of the aperture array and the recording medium are uniformly maintained, for example are maintained with several tens nm in order to record information on the recording medium 200 with a high reliability. Meanwhile, in order to record the fine pattern at a high speed, the aperture array is provided with a plurality of fine apertures, accordingly an area of the aperture array becomes wider. For example, when a distance between the fine aperture having a distance of 10□ and 1000×1000 number of apertures are arranged, the area of the aperture array 10×10 mm². It is not easy that an interval between the aperture array and the recording medium is maintained with several tens nm over a region having such area. Assuming that the interval between the fine aperture and the recording medium is 40 nm and the used light source having a wavelength of 532 nm, it is estimated that an interval is approximately maintained within approximately 4~5 nm in order to maintain the reliability of the information to be recorded, it is corresponded to λ/100 with reference to the used wavelength. In order to maintain such interval, the surface flatten degree of the aperture array and the recording medium is maintained, and it is very difficult task that a surface having such flatteness.

On the other hand, a thickness of a silicon substrate used for manufacturing a recent semiconductor tends to thin below several hundreds □; accordingly, the substrate has a considerable flexibility. In case when the recording medium has the flexibility as described above, a state that the surface of the recording surface tightly contacts with the immersion thin film layer is maintained by applying pressure to the recording medium as shown in FIG. 7. That is, if the state in contact with the immersion thin film layer is maintained with slightly bending the surface of the recording medium due to the pressure applied to the recording medium, the interval between the aperture array and the recording medium can be maintained uniformly by a thickness of the immersion thin film layer. For example, an oil pressure can be used as the unit for applying pressure to the recording medium.

Although the embodiments in accordance with the above described present invention describes for at least one fine aperture, therefore all of the corresponding light capacity control cell and the micro-lens are at least one, the present invention does not limit to these and it is apparent to those skilled in the art that the present invention can be applied for one fine aperture. For example, such device can be used for a case that information is stored on the recording medium in a shape of a straight line or a curve.

Although the embodiments of the present invention for the optical modulation fine aperture array device provided with an immersion thin film layer and a high speed fine pattern recording system using the same are described with reference to the accompanying drawings, only the preferred embodiments of the present invention are exemplarily described, but not limit to the present invention.

And also, while the present invention has been described with respect to certain preferred embodiments, it will be apparent to those skilled in the art that various changes and modifications may be made without departing from the scope of the invention as defined in the following claims.

The invention claimed is:

1. An optical modulating fine aperture array device, comprising:
   a mask substrate made of an optical transparent material;
   a metal thin film formed on a lower side of the substrate, including an aperture array which is provided with a plurality of fine apertures for generating an evanescent field;
   an immersion thin film layer formed on the metal thin film and made of an optically transparent dielectric solid material, and formed to have a predetermined thickness, wherein the immersion thin film layer uniformly maintains a distance between the metal thin film and a recording medium to be formed into resist patterns,
   wherein the apertures and the thickness of the immersion thin film layer are sized so as to generate the evanescent field between the apertures and the recording medium.

2. The optical modulating fine aperture array device as recited in claim 1, further comprising a micro-lens array arranged on an upper side of the mask substrate and provided with a plurality of micro-lenses arranged in a shape of a matrix, wherein each of the micro-lenses condenses the light passing through each of a plurality of light capacity control cells.

3. The optical modulating fine aperture array device as recited in claim 1, further including a protection layer arranged on the immersion thin film layer.

4. The optical modulating fine aperture array device as recited in claim 3, wherein the protection layer is made of a diamond like carbon.

5. The optical modulating fine aperture array device as recited in claim 1, wherein each fine aperture of the aperture array is filled with a material same as the immersion thin film layer.

6. The optical modulating fine aperture array device as recited in claim 1, wherein the aperture array is arranged in a shape of a matrix.

7. A high speed fine pattern recording system, comprising:
   a light source unit for emitting light having a predetermined wavelength;
   a parallel light generation unit for making the light emitted from the light source unit a parallel light;
   an optical modulation fine aperture array device including:
   a spatial light modulation unit provided with a plurality of light capacity control cells arranged in a shape of a matrix, wherein each of the light capacity control cells is capable of individually controlling a degree of an input light which passes therethrough;
   a micro-lens array provided with a plurality of micro-lenses arranged in a shape of a matrix, wherein each of the micro-lenses condenses the light passing through each of the light capacity control cells;
   a mask substrate made of an optical transparent material and having a thickness substantially to a focal length of the micro-lenses, wherein the micro-lens array is attached to one side of the mask substrate;
   a metal thin film formed on another side surface of the mask substrate, including an aperture array provided with a plurality of fine apertures for generating an evanescent field, wherein each of the fine apertures discharges light passing through the mask substrate; and
   an immersion thin film layer formed on the metal thin film and made of an optically transparent dielectric solid material, and formed to have a predetermined thickness;
   a recording medium supporting device for supporting a recording medium on which predetermined patterns are recorded by the light emitted from the aperture array of the optical modulation fine aperture array device; and
   a scan device generating a relative movement between the optical modulation fine aperture array device and the recording medium supported by the recording medium supporting device by being connected to the optical modulation fine aperture array device or the recording medium supporting device and moving the connected devices;
   wherein the immersion thin film layer is configured to uniformly maintain a distance between the aperture array and the recording medium so as to generate the evanescent field between the apertures and the recording medium.

8. The high speed fine pattern recording system as recited in claim 7, further including a protection layer arranged on a surface facing the aperture array of the immersion thin film layer.

9. The high speed fine pattern recording system as recited in claim 8, wherein a relative movement between the optical modulation fine aperture array device and the recording medium is performed at a state that the protection layer is in contact with the surface of the recording medium.

10. The high speed fine pattern recording system as recited in claim 9, wherein the recording medium supporting device secures that a relative movement is capable of being performed by applying a pressure to a surface of the recording medium which is not in contact with the protection layer in a state that a surface of the immersion thin film layer is in contact with the surface of the recording medium.

11. An optical modulation fine aperture device, comprising:
   a light capacity control cell capable of controlling a degree that an inputted light passes therethrough;
   a micro-lens for condensing the light passed through the light capacity control cell;
   a substrate made of an optically transparent material and having a thickness substantially equal to a focal length of the micro-lens, wherein the micro-lens is attached to one side surface;
   a metal thin film including a plurality of fine apertures for generating an evanescent field, arranged on the other side surface of the substrate for emitting the light passing through the substrate; and
   an immersion thin film layer made of an optically transparent dielectric and having a refractive index being larger than that of air so as to have a predetermined thickness to uniformly maintain a distance between the fine apertures and a recording medium,
   wherein the apertures and the thickness of the immersion thin film layer are sized so as to generate the evanescent field between the apertures and the recording medium.

* * * * *